United States Patent [19]
Kierse

[11] Patent Number: 5,486,720
[45] Date of Patent: Jan. 23, 1996

[54] EMF SHIELDING OF AN INTEGRATED CIRCUIT PACKAGE

[75] Inventor: Oliver J. Kierse, County Clare, Ireland

[73] Assignee: Analog Devices, Inc., Norwood, Mass.

[21] Appl. No.: 250,166

[22] Filed: May 26, 1994

[51] Int. Cl.$^6$ ............... H01L 23/06; H01L 23/36; H01L 23/482
[52] U.S. Cl. ............... 257/659; 257/706; 257/707; 257/713; 257/723; 257/725; 257/796
[58] Field of Search ............... 257/659, 660, 257/723, 724, 700, 713, 717, 704, 696, 706, 707, 796, 668, 690, 698, 725; 361/709, 712, 713, 718

[56] References Cited

U.S. PATENT DOCUMENTS

| | | | |
|---|---|---|---|
| 3,902,148 | 8/1975 | Drees et al. | 357/70 |
| 4,829,403 | 5/1989 | Harding | 257/713 |
| 5,172,213 | 12/1992 | Zimmerman | 257/796 |
| 5,175,613 | 12/1992 | Barker, III et al. | 257/713 |
| 5,184,211 | 2/1993 | Fox | 257/706 |
| 5,294,826 | 3/1994 | Marcantonio et al. | 257/659 |
| 5,317,107 | 5/1994 | Osorio | 257/659 |
| 5,371,404 | 12/1994 | Juskey et al. | 257/659 |

FOREIGN PATENT DOCUMENTS

| | | | |
|---|---|---|---|
| 0278752 | 11/1990 | Japan | 257/659 |
| 0049650 | 2/1992 | Japan | 257/723 |
| 0152554 | 5/1992 | Japan | 257/659 |

Primary Examiner—Peter Toby Brown
Attorney, Agent, or Firm—Koppel & Jacobs

[57] ABSTRACT

A package for housing integrated circuit chips that provides EMF shielding and thermal protection, while conforming to an industry recognized package outline, is provided. This EMF shielding and thermal protection is achieved by providing an electrically conductive heat sink that provides heat dissipation and that, together with a separate electrically conductive layer, also acts as an EMF shield. The heat sink contains a recess and is positioned against the conductive layer with the recess facing the conductive layer. The integrated circuit (IC) resides inside the cavity formed by the heat sink and conductive layer and is protected from EMF by the heat sink and conductive layer. The heat sink, electrically conductive layer and IC are then encapsulated in an electrically insulating molding compound that is molded to an industry recognized package outline. Additional ICs can be housed in this package by attaching them to the side of the electrically conductive layer opposite the heat sink. These additional ICs are protected from EMF emanating from the IC that is housed inside the cavity. This allows for the possibility of housing EMF-generating components and EMF-sensitive components in the same package.

25 Claims, 4 Drawing Sheets

EMF SHIELDING OF AN INTEGRATED CIRCUIT PACKAGE

BACKGROUND OF THE INVENTION

1. Field of the Invention

The present invention relates to the housing and protection of integrated circuit chips. More specifically, the present invention relates to a package that provides electromagnetic field (EMF) shielding and thermal protection for integrated circuit chips.

2. Description of the Related Art

Modern integrated circuits require protection from self-heating effects, electromagnetic fields, electrostatic discharge, and mechanical shock in order to operate properly. In addition, the integrated circuit (IC) itself could be a source of EMF emissions that could be potentially harmful to other electronic devices in close proximity to the IC, or that could result in a violation of FCC regulations regarding EMF emissions.

These considerations have created a need for a package that will provide an IC with substantial shielding from EMF emissions originating outside of the IC package and also protect other sensitive electronic devices and the environment in general from EMF emissions originating from the IC itself. In addition, the package should provide adequate heat dissipation in order to keep the IC temperature within allowable operating limits.

Many prior art IC packages have been made that address the heat dissipation issue. These packages usually employ a post made of heat conducting material or an enclosure that incorporates a heat sink with cooling vanes to facilitate heat dissipation. Some of these packages, such as that disclosed in U.S. Pat. No. 5,175,613, entitled "PACKAGE FOR EMI, ESD, THERMAL, AND MECHANICAL SHOCK PROTECTION OF CIRCUIT CHIPS", issued Dec. 29, 1992 to C. Barker, et. al., have addressed both EMF shielding and heat dissipation. However, the physical dimensions of this package do not conform to an industry recognized package outline, such as those recognized by the Joint Electron Device Engineering Council (JEDEC) or the Electronics Industry Association of Japan (EIJA). The Barker package cannot be handled by the auto-insertion equipment that is typically used by board assemblers because of the physical dimensions and size of these packages.

Another limitation of the Barker package is that it is not possible to house both EMF-generating components and EMF-sensitive components simultaneously in the same package. The reason for this is that this package does not provide an option for shielding two or more components from each other if they are mounted in the same package. If an EMF-generating component is mounted inside this package, then the only EMF-sensitive components that are protected from EMF emissions are those that are mounted outside the package. Conversely, if an EMF-sensitive component is mounted inside the package, then it will only be protected from EMF emissions emanating from electronic devices disposed outside the package.

Other packages, such as those disclosed in U.S. Pat. No. 5,184,211, entitled "APPARATUS FOR PACKAGING AND COOLING INTEGRATED CIRCUIT CHIPS", issued Feb. 2, 1993 to L. Fox, U.S. Pat. No. 3,902,148, entitled "SEMICONDUCTOR LEAD STRUCTURE AND ASSEMBLY AND METHOD FOR FABRICATING SAME", issued Aug. 26, 1975 to J. Drees, et. al., and U.S. Pat. No. 5,172,213, entitled "MOLDED CIRCUIT PACKAGE HAVING HEAT DISSIPATING POST" issued Dec. 15, 1992 to M. Zimmerman address only the heat dissipation issue. The Fox package, like the Barker package, does not conform to an industry recognized package outline.

Summary of the Invention

In view of the limitations of the prior packages for housing integrated circuits, the present invention seeks to provide a package for housing one or more integrated circuits which will protect these integrated circuits from EMF emissions and thermal shock and also shield other electrical devices and the environment in general from EMF emissions, while still conforming to an industry recognized package outline.

These improvements are achieved by using an electrically conductive heat sink that provides heat dissipation and that, together with a separate electrically conductive layer, also acts as an EMF shield. The heat sink contains a recess and is positioned against the conductive layer with the recess facing the conductive layer. The integrated circuit (IC) resides inside the cavity formed by the heat sink and conductive layer and is protected from EMF by the heat sink and conductive layer.

In the preferred embodiment, these improvements are achieved by attaching a standard leadframe, which includes a leadframe paddle and lead fingers, to an electrically conductive heat sink that contains a recess. The heat sink is attached to the leadframe with the recess facing the leadframe and is electrically isolated from the leadframe, except for a ground connection, by using an electrically insulating material, such as electrically insulating adhesive or tape. This arrangement forms a cavity within the recess of the heat sink.

The integrated circuit (IC) resides inside this cavity and is electrically insulated from the heat sink. In addiction, the electrical leads on the IC are connected to the lead fingers with wire bonds. The lead fingers then become, in effect, extensions of the IC leads.

In order to complete the EMF shielding, an electrically conductive layer is attached to the side of the leadframe opposite the heat sink. This electrically conductive layer must be electrically isolated from the IC in order to achieve EMF shielding. In addition, the electrically conductive layer must be electrically isolated from the leadframe, except for a ground connection, to avoid shorting out the lead fingers. This electrical isolation can be accomplished by either using electrically insulating adhesive to attach the electrically conductive layer or by sandwiching the electrically conductive layer between two insulating layers before attaching it to the leadframe.

The combination of the heat sink and electrically conductive layer substantially shields the IC from EMF. The EMF shielding is not 100% because there is the potential for EMF to reach the IC through the gap between the heat sink and the leadframe. Effective EMF protection is still achieved, however, because the gap thickness accounts for only about 10% of the total thickness for the heat sink and electrically conductive layer combination.

Heat sinking is achieved by a thermal connection between the heat sink and the IC. Thus, the heat sink serves as both a thermal conductor and a component of the EMF shield.

Additional ICs can housed by attaching them to the side of the electrically conductive layer opposite the leadframe. As with the IC mounted inside the cavity, these additional ICs must be electrically isolated from the electrically conductive layer attached to the leadframe. If the electrically conductive layer is sandwiched between two electrically insulating layers as discussed above, then the additional ICs can be attached directly to the electrically insulating layer. Otherwise, electrically insulating adhesive can be used. These additional ICs are protected from EMF emanating from the IC that is housed inside the cavity. This allows for the possibility of housing EMF-generating components and EMF-sensitive components in the same package.

The heat sink, leadframe, electrically conductive layer, and ICs are then encapsulated in an electrically insulating molding compound. The compound is molded to an industry recognized package outline, such as those recognized by JEDEC or EIJA, which will make it possible for the package to be handled by the auto-insertion equipment that is typically used by board assemblers.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
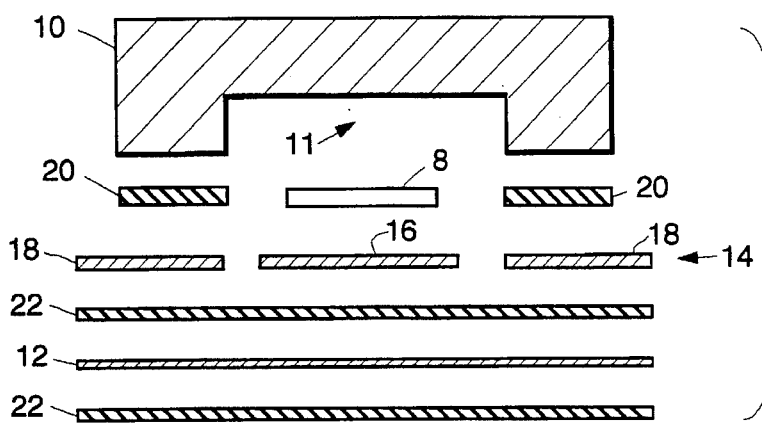
FIG. 1 is an exploded sectional view illustrating the basic elements of the invention.

FIG. 1 illustrates the basic principles of the invention. The basic principle involved in providing EMF shielding for an IC 8 is to surround the IC 8 with electrically conductive material that is electrically grounded. Although the IC 8 needs to be surrounded by electrically conductive material, the IC 8 cannot be in electrical contact with the electrically conductive material because, otherwise, EMF will be coupled to the IC 8. In the present invention, this EMF shielding concept is implemented with an electrically conductive heat sink 10 on one side of the IC, and an electrically conductive layer 12 on the other side of the IC.

Figure 2:
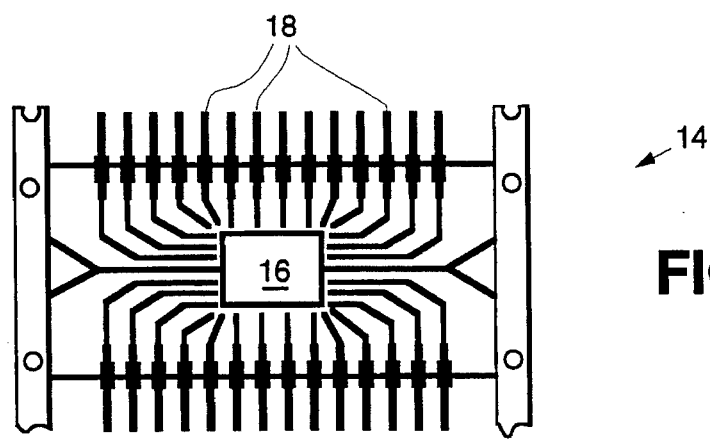
FIG. 2 is a plan view of a leadframe employed in the embodiment of FIG. 1.

The heat sink 10 contains a recess 11 and is attached to a standard leadframe 14, which includes a leadframe paddle 16 and lead fingers 18, with the recess facing the leadframe 14. A plan view of the leadframe 14 is provided in FIG. 2. The heat sink 10 is electrically isolated from the lead fingers 18, except at a point where a ground connection is made between the heat sink 10 and a lead finger 18 that is connected to ground. This keeps the heat sink 10 from shorting out the lead fingers 18. This electrical isolation is provided by using an electrically insulating layer 20, such as an electrically insulating adhesive, gel or tape, between the heat sink 10 and the lead fingers 18. An opening in the insulating layer 20 over the lead finger 18 that is connected to ground allows for a ground connection to the heat sink 10. The IC 8 resides within the recess 11 of the heat sink 10.

The leadframe paddle 16 may be removed, depending upon where the IC 8 is mounted. For example, if the IC 8 is attached directly to the heat sink 10, then the leadframe paddle 16 is not used. The IC 8 is then attached to the heat sink 10 before the electrically conductive layer 12 is attached. If the IC 8 is attached to the leadframe paddle 14, it is attached to the leadframe paddle 16 before the heat sink 10 and leadframe 14 are attached together.

Figure 3:
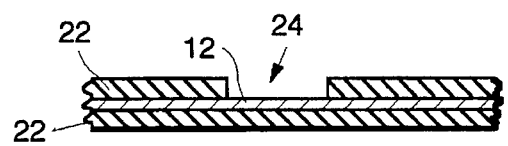
FIG. 3 is an enlarged sectional view of an electrically conductive layer and electrically insulating layer combination used in the embodiment of FIG. 1.

To complete the EMF shielding, the electrically conductive layer 12, which is preferably formed from copper about 0.0254 mm thick, is attached to the side of the leadframe 14 opposite the heat sink 10. As with the heat sink 10, the electrically conductive layer 12 must be electrically isolated from the lead fingers 18, except at a point where a ground connection is made between the electrically conductive layer 10 and a lead finger 18 that is connected to ground, to avoid shorting the lead fingers 18 together. This can be accomplished by sandwiching the electrically conductive layer 12 between two electrically insulating layers 22. FIG. 3 provides a detailed view of this arrangement. An opening 24 in the electrically insulating layer 22 over the grounded lead finger 18 allows for a ground connection to the electrically conductive layer 12.

Figure 4:
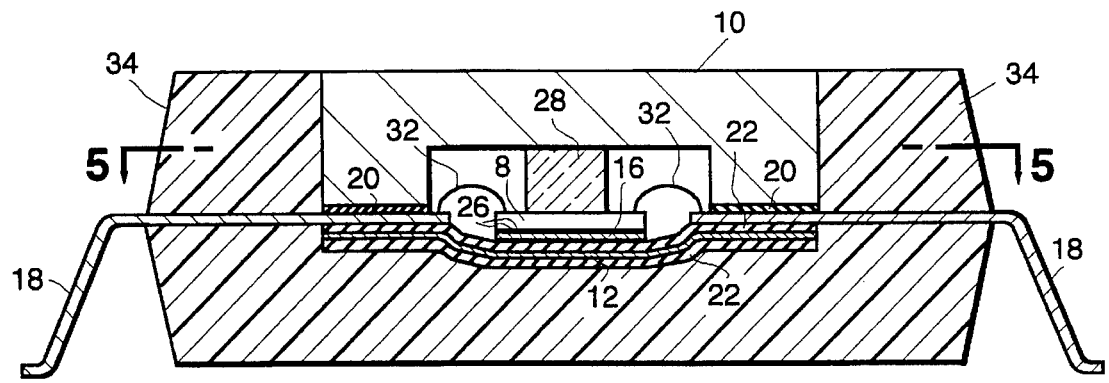
FIG. 4 is a sectional view of the preferred embodiment with the IC mounted on a leadframe paddle.

FIG. 4 illustrates the various elements of the invention assembled together in the preferred embodiment. The entire assembly is encapsulated in an electrically insulating molding compound 34 such that the lead fingers 18 extend beyond the boundaries of the molding compound 34. The molding compound 34 is molded to an industry recognized package outline, such as those recognized by the Joint Electron Device Engineering Council (JEDEC) or the Electronics Industry Association of Japan (EIJA), which will make it possible for the package to be handled by the auto-insertion equipment that is typically used by board assemblers. The upper surface of the heat sink 10 is flush with the upper surface of the molding compound for this purpose.

The IC 8 is substantially protected from EMF emissions, however, the protection is not 100% because of the existence of gaps in the electrically conductive "shield" formed by the heat sink 10 and the electrically conductive layer 12. These gaps are located at the electrically insulating layer 20 between the heat sink 10 and the lead fingers 18 and at the electrically insulating layer 22 between the lead fingers 18 and the electrically conductive layer 12. Effective EMF protection is still achieved, however, because the gap thickness accounts for only about 10% of the total thickness for the heat sink 10 and electrically conductive layer 12 combination.

A thermal path is provided by making a thermal connection between the IC 8 and the heat sink 10. In this way, the heat sink 10 serves as both a component of the EMF shield and as a thermal conductor. In the embodiment of FIG. 4, the IC 8 is attached to the leadframe paddle 16 with thermally conductive and electrically insulating adhesive 26 before the heat sink 10 is attached to the leadframe 14. To make a thermal connection between the IC 8 and the heat sink 10, a thermally conductive gel 28, such as high thermal conductivity silicone, is placed between the IC 8 and the heat sink 10 before the heat sink 10 is attached to the leadframe 14.

Figure 5:
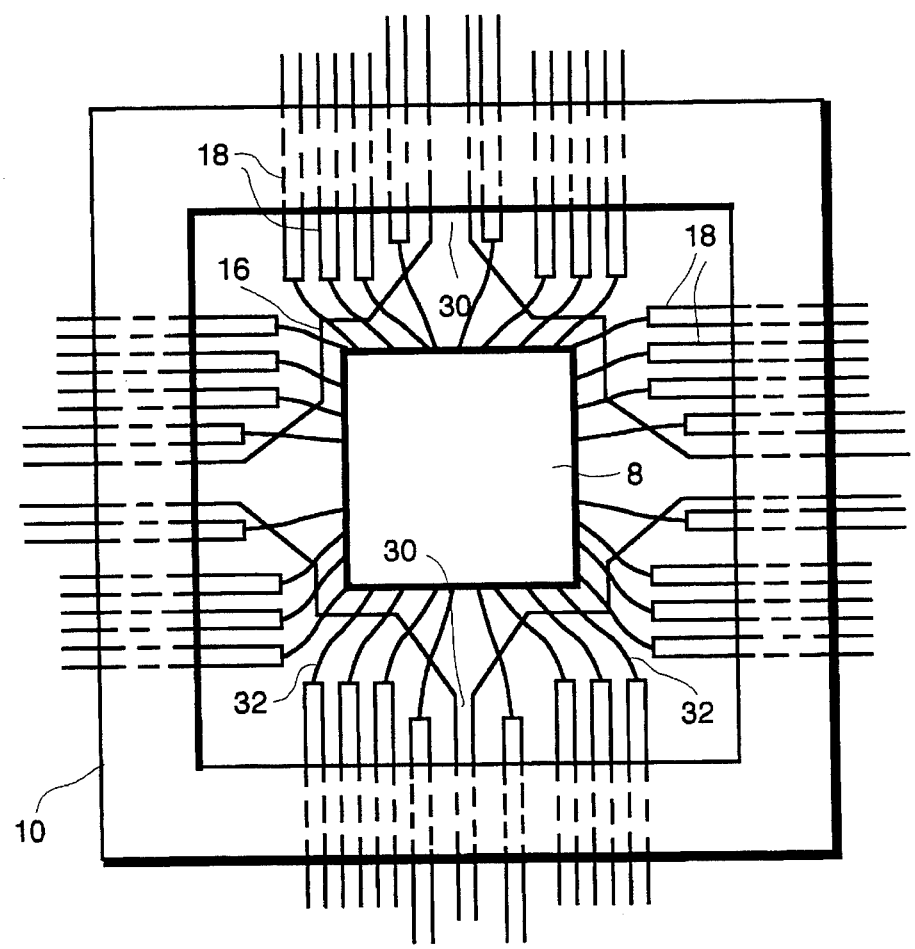
FIG. 5 is a sectional view taken along the section line 5—5 of FIG. 4.

An additional thermal connection can be made by incorporating heat spreaders 30 on the leadframe paddle 16. Heat spreaders 30 are simply extensions of the leadframe paddle 16, as shown in FIG. 5. Since the leadframe 14 is typically made of thermally conductive material, such as copper, and since the IC 8 is attached to the leadframe paddle with a thermally conductive and electrically insulating adhesive 26, these heat spreaders conduct heat away from the IC 8. Thermal connections between the heat spreaders 30 and the heat sink 10 can then be made at locations where the heat sink 10 is directly above a heat spreader 30. These connections can be accomplished by either making the electrically insulating layer 20 thermally conductive, such as by using polyimide tape or adhesive, or by providing openings in the electrically insulating layer 20 where the heat sink 10 is directly above a heat spreader 30.

Electrical leads on the IC 8 are connected to the lead fingers 18 with wire bonds 32. The lead fingers 18 then become, in effect, extensions of the IC 8 leads.

Figure 6:
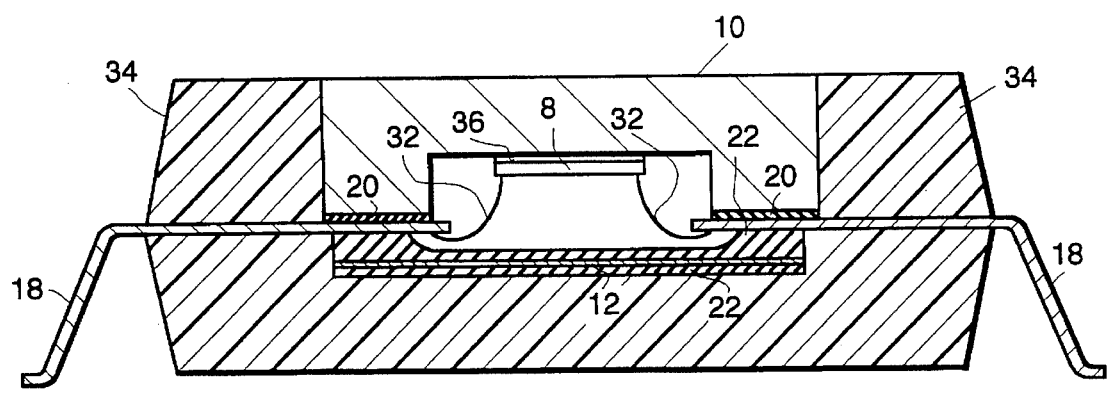
FIG. 6 is a sectional view of an embodiment that has an IC inside the enclosure mounted on heat sink with electrically insulating and thermally conductive adhesive.

FIG. 6 illustrates an embodiment in which the IC 8 is mounted directly to the heat sink 10 with a thermally conductive but electrically insulating adhesive 36. The leadframe paddle 16 is not used in this configuration. The IC 8 is then attached to the heat sink 10. In this configuration, heat is directly transferred to the heat sink 10 and is dissipated, while electrical isolation is maintained between the heat sink 10 and the IC 8.

Figure 7:
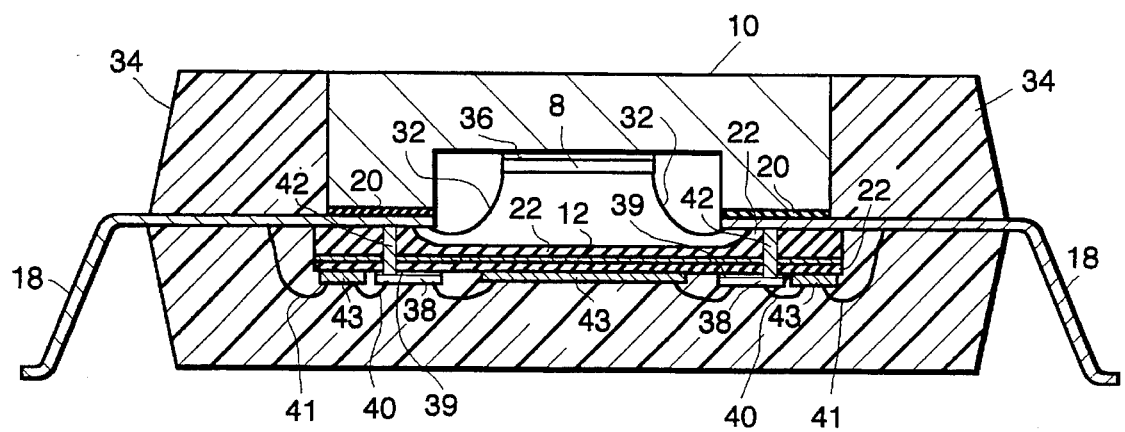
FIG. 7 is a sectional view of an embodiment that has an IC inside the enclosure mounted on a heat sink and additional ICs mounted outside the enclosure on an electrically insulating layer.
Figure 8:
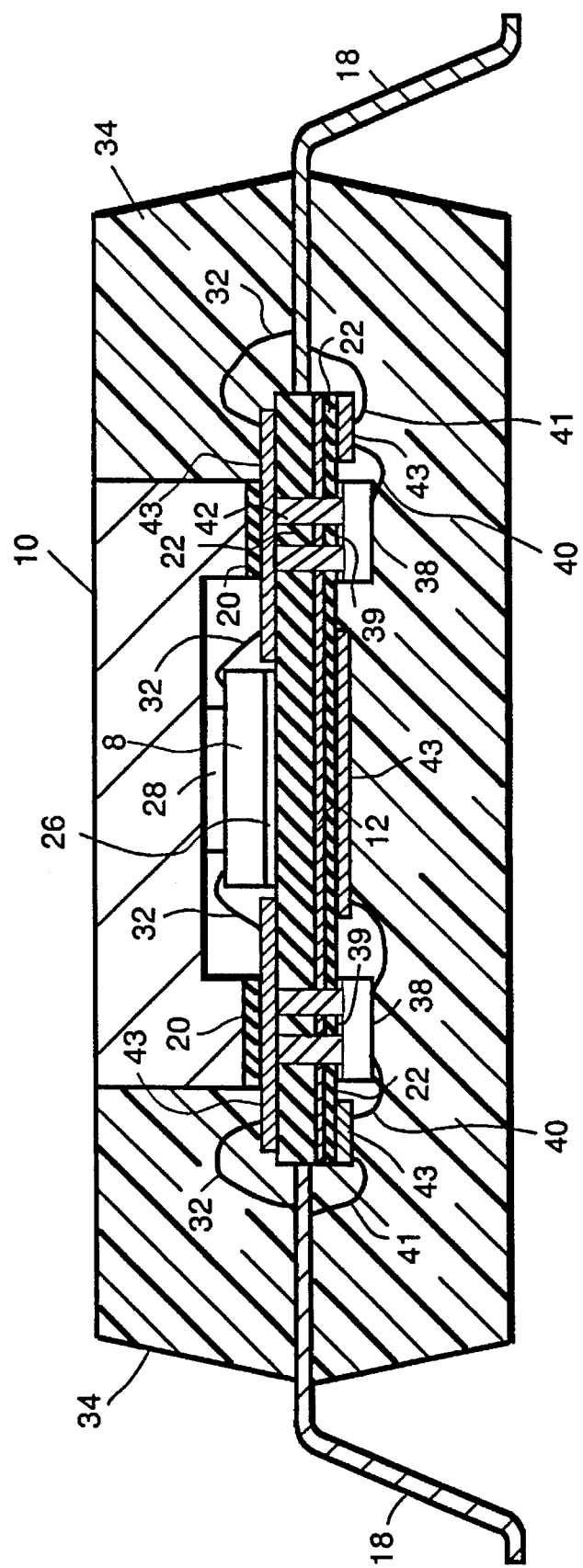
FIG. 8 is a sectional view of an embodiment that has an IC inside the enclosure and additional ICs outside the enclosure mounted on electrically insulating layers.

FIGS. 7 and 8 illustrate embodiments in which additional ICs 38 are housed in the package outside the EMF shielded enclosure. These ICs 38 are protected from EMF emissions emanating from the IC 8 inside the EMF shielded enclosure. This embodiment, therefore, allows for the packaging of EMF-generating components and EMF-sensitive components in the same package. The IC 8 inside the enclosure can be an EMF-generating component and the ICs 38 outside the enclosure can be EMF-sensitive components.

The additional ICs 38 are preferably attached to the electrically insulating layer 22 located at the bottom of the electrically conductive layer 12 with thermally conductive but electrically insulating adhesive 39. Electrically conductive tracks 43 are incorporated into the electrically insulating layer 22 upon which the additional ICs are mounted. Electrical connections between the IC 38 leads and the lead fingers 18 are made by connecting the IC 38 leads to the conductive tracks 43 with wire bonds 40, and connecting the conductive tracks 43 to the lead fingers 18 with additional wire bonds 41.

A thermal path for the additional ICs 38 is provided by metal feedthroughs 42 that extend from the ICs 38 through the electrically insulating layers 22 and electrically conductive layer 12 to the heat spreaders 30.

In the embodiment of FIG. 7, the IC 8 inside the enclosure is mounted to the heat sink as in FIG. 6. In the embodiment of FIG. 8, the leadframe paddle 16 has been removed and the IC 8 inside the enclosure is attached to the electrically insulating layer 22 that faces the heat sink 10. This electrically insulating layer 22, like the electrically insulating layer 22 upon which the additional ICs 38 are mounted, can contain electrically conductive tracks 43. The leads on the IC 8 inside the enclosure can then be connected to the lead fingers 18 using the same wire bonding method used for connecting the leads on the additional ICs 38 to the lead fingers 18.

In the embodiment of FIG. 8, a thermal path for the IC 8 may be achieved by using the same thermally conductive gel 28 as in FIG. 4. Although there is no leadframe paddle 16 in this embodiment, a heat spreader 30, as described earlier and shown in FIG. 5 can be used by incorporating thermally conductive tracks on the electrically insulating layer 22 on which the IC 8 is mounted. These thermally conductive tracks are thermally connected to the heat sink 10 using the same technique described earlier for the heat spreaders 30.

Numerous other variations and alternate embodiments will occur to those skilled in the art without departing from the spirit and scope of the invention. Accordingly, it is intended that the invention be limited only in terms of the appended claims.

I claim:

1. An electromagnetically shielded circuit package, comprising:

a leadframe having a plurality of lead fingers, an electrically conductive heat sink disposed on said leadframe, said heat sink having a recess that faces said leadframe, a ground connection for said heat sink, a first electrically insulating layer between said heat sink and said leadframe, an electrically conductive layer disposed on a side of said leadframe facing away from said heat sink and, together with said heat sink, forming an electromagnetic field shielded enclosure, a ground connection for said electrically conductive layer, a second electrically insulating layer between said electrically conductive layer and said leadframe, a first electrical device disposed within said enclosure in thermal communication with said heat sink and shielded from outside electromagnetic fields by said heat sink and electrically conductive layer, a third electrically insulating layer on a side of said electrically conductive layer that faces away from said heat sink, electrically conductive tracks on said third electrically insulating layer, said tracks in electrical communication with said lead fingers, at least one other electrical device disposed outside of said enclosure and attached to said third electrically insulating layer, said at least one other electrical device having leads in electrical communication with said electrically conductive tracks, and being shielded from electromagnetic energy emitted from said first electrical device within said enclosure, and an electrically insulating molding material encapsulating said heat sink, leadframe, electrically conductive layer, electrically insulating layers, and all of said electrical devices.

2. The package of claim 1, wherein said first electrical device is attached to said heat sink.

3. The package of claim 2, wherein said first electrical device is attached with a thermally conductive and electrically insulating adhesive.

4. The package of claim 1, wherein said ground connection for said electrically conductive layer comprises an electrical connection between said electrically conductive layer and a lead finger that is electrically grounded.

5. The package of claim 4, further comprising a thermal conduction path for conducting heat away from said at least one other electrical device.

6. The package of claim 5, wherein said thermal conduction path comprises heat spreaders disposed on a side of said second electrically insulating layer that faces said heat sink, said heat spreaders in thermal communication with said at least one other electrical device and said heat sink to dissipate heat from said at least one other electrical device through said heat sink.

7. The package of claim 6, wherein said thermal communication between said at least one other electrical device and said heat spreaders comprises one or more thermal conductors in thermal communication with said heat spreaders, said thermal conductors extending through said electrically conductive layer and said second and third insulating layers to said at least one other electrical device, said thermal conductors in thermal communication with said at least one other electrical device, and said thermal conductors electrically insulated from said electrically conductive layer.

8. The package of claim 6, further comprising:

electrically conductive tracks disposed on said second electrically insulating layer, said first electrical device disposed on said second electrically insulating layer, and leads on said first electrical device in electrical communication with said electrically conductive tracks on said second electrically insulating layer, said lead fingers in electrical communication with said electrically conductive tracks on said second electrically insulating layer.

9. The package of claim 8, wherein said thermal communication between said first electrical device and said heat sink comprises thermally conductive material disposed between said first electrical device and said heat sink.

10. The package of claim 8, wherein said first electrical device and said heat sink are in thermal communication with said heat spreaders.

11. The package of claim 10, wherein said thermal communication between said first electrical device, heat sink and heat spreaders comprise thermally conductive and electrically insulating material disposed between said first electrical device and said heat spreaders, and between said heat sink and said heat spreaders.

12. An electromagnetically shielded circuit package, comprising:

a leadframe having a plurality of lead fingers, an electrically conductive heat sink disposed on said leadframe, said heat sink having a recess that faces said leadframe, a ground connection for said heat sink, a first electrically insulating layer disposed between said heat sink and said leadframe, an electrically conductive layer disposed on a side of said leadframe facing away from said heat sink, a ground connection for said electrically conductive layer, said ground connection comprising an electrical connection between said electrically conductive layer and a lead finger that is electrically grounded, said conductive layer together with said heat sink forming an electromagnetic field shielded enclosure, a second electrically insulating layer disposed between said leadframe and said electrically conductive layer, an electrical device disposed within said enclosure, attached to said heat sink, and shielded from outside electromagnetic fields by said heat sink and said electrically conductive layer, a third electrically insulating layer on a side of said electrically conductive layer that faces away from said heat sink, electrically conductive tracks on said third electrically insulating layer, said tracks in electrical communication with said lead fingers, at least one other electrical device disposed outside of said enclosure and attached to said third electrically insulating layer, said at least one other electrical device having leads in electrical communication with said electrically conductive tracks, and being shielded from electromagnetic energy emitted from said electrical device within said enclosure, and electrically insulating molding material encapsulating said leadframe, heat sink, electrically conductive layer, electrical devices, and electrically insulating layers.

13. The package of claim 12, further comprising a thermal conduction path for conducting heat away from said at least one other electrical device.

14. The package of claim 13, wherein said thermal conduction path comprises heat spreaders disposed on a side of said second electrically insulating layer that faces said heat sink, said heat spreaders in thermal communication with said at least one other electrical device and said heat sink so that heat from said at least one other electrical device is dissipated through said heat sink.

15. The package of claim 14, wherein said thermal communication between said at least one other electrical device and said heat spreaders comprises one or more thermal conductors in thermal communication with said heat spreaders, said thermal conductors extending through said electrically conductive layer and said second and third insulating layers to said at least one other electrical device, said thermal conductors in thermal communication with said at least one other electrical device, and said thermal conductors electrically insulated from said electrically conductive layer.

16. An electromagnetically shielded circuit package, comprising:

a leadframe having a plurality of lead fingers, an electrically conductive heat sink disposed on said leadframe, said heat sink having a recess that faces said leadframe, a ground connection for said heat sink, an electrically conductive layer disposed on a side of said leadframe facing away from said heat sink and, together with said heat sink, forming an electromagnetic field shielded enclosure, a ground connection for said electrically conductive layer, said ground connection comprising an electrical connection between said electrically conductive layer and a lead finger that is electrically grounded, a first electrical device disposed within said enclosure in thermal communication with said heat sink and shielded from outside electromagnetic fields by said heat sink and electrically conductive layer, at least one other electrical device disposed outside of said enclosure, said at least one other electrical device being shielded from electromagnetic energy emitted from said first electrical device within said enclosure, a first electrically insulating layer disposed between said heat sink and said leadframe, a second electrically insulating layer disposed between said leadframe and said electrically conductive layer, a third electrically insulating layer disposed on a side of said electrically conductive layer that faces away from said heat sink, electrically conductive tracks disposed on said third electrically insulating layer, said tracks in electrical communication with said lead fingers and with leads on said at least one other electrical device, a thermal conduction path for conducting heat away from said at least one other electrical device, and an electrically insulating molding material encapsulating said heat sink, leadframe, electrically conductive layer, and all of said electrical devices.

17. The package of claim 16, wherein said thermal conduction path comprises heat spreaders disposed on a side of said second electrically insulating layer that faces said heat sink, said heat spreaders in thermal communication with said at least one other electrical device and said heat sink to dissipate heat from said at least one other electrical device through said heat sink.

18. The package of claim 17, wherein said thermal communication between said at least one other electrical device and said heat spreaders comprises one or more thermal conductors in thermal communication with said heat spreaders, said thermal conductors extending through said electrically conductive layer and said second and third insulating layers to said at least one other electrical device, said thermal conductors in thermal communication with said at least one other electrical device, and said thermal conductors electrically insulated from said electrically conductive layer.

19. The package of claim 17, further comprising:

electrically conductive tracks disposed on said second electrically insulating layer, said first electrical device disposed on said second electrically insulating layer, and leads on said first electrical device in electrical communication with said electrically conductive tracks on said second electrically insulating layer, said lead fingers in electrical communication with said electrically conductive tracks on said second electrically insulating layer.

20. The package of claim 19, wherein said thermal communication between said first electrical device and said heat sink comprises thermally conductive material disposed between said first electrical device and said heat sink.

21. The package of claim 19, wherein said first electrical device and said heat sink are in thermal communication with said heat spreaders.

22. The package of claim 21, wherein said thermal communication between said first electrical device, heat sink and heat spreaders comprise thermally conductive and electrically insulating material disposed between said first electrical device and said heat spreaders, and between said heat sink and said heat spreaders.

23. An electromagnetically shielded circuit package, comprising:

a leadframe having a plurality of lead fingers, an electrically conductive heat sink disposed on said leadframe, said heat sink having a recess that faces said leadframe, a ground connection for said heat sink, a first electrically insulating layer disposed between said heat sink and said leadframe, an electrically conductive layer disposed on a side of said leadframe facing away from said heat sink, a ground connection for said electrically conductive layer, said ground connection comprising an electrical connection between said electrically conductive layer and a lead finger that is electrically grounded, said conductive layer together with said heat sink forming an electromagnetic field shielded enclosure, a second electrically insulating layer disposed between said leadframe and said electrically conductive layer, an electrical device disposed within said enclosure, attached to said heat sink, and shielded from outside electromagnetic fields by said heat sink and said electrically conductive layer, at least one other electrical device disposed outside of said enclosure, said at least one other electrical device being shielded from electromagnetic energy emitted from said electrical device within said enclosure, a third electrically insulating layer disposed on a side of said electrically conductive layer that faces away from said heat sink, electrically conductive tracks disposed on said third electrically insulating layer, leads on said at least one other electrical device in electrical communication with said lead fingers, a thermal conduction path for conducting heat away from said additional electrical devices, and electrically insulating molding material encapsulating said leadframe, heat sink, electrically conductive layer, electrical devices, and electrically insulating layers.

24. The package of claim 23, wherein said thermal conduction path comprises heat spreaders disposed on a side of said second electrically insulating layer that faces said heat sink, said heat spreaders in thermal communication with said at least one other electrical device and said heat sink so that heat from said at least one other electrical device is dissipated through said heat sink.

25. The package of claim 24, wherein said thermal communication between said at least one other electrical device and said heat spreaders comprises one or more thermal conductors in thermal communication with said heat spreaders, said thermal conductors extending through said electrically conductive layer and said second and third insulating layers to said at least one other electrical device, said thermal conductors in thermal communication with said at least one other electrical device, and said thermal conductors electrically insulated from said electrically conductive layer.

* * * * *